WIDE-BAND TRANSISTOR AMPLIFIER SYSTEM EMPLOYING IMPEDANCE MISMATCH AND HIGH FREQUENCY PEAKING

Original Filed June 14, 1962

INVENTOR
IRVING HOROWITZ
BY Rines and Rines
ATTORNEYS 3,329,904

WIDE-BAND TRANSISTOR AMPLIFIER SYSTEM EMPLOYING IMPEDANCE MISMATCH AND HIGH FREQUENCY PEAKING

Irving Horowitz, Eatontown, N.J., assignor to Blonder-Tongue Electronics, Newark, N.J., a corporation of New Jersey

Continuation of application Ser. No. 202,410, June 14, 1962. This application Nov. 22, 1965, Ser. No. 518,504
3 Claims. (Cl. 330—21)

Figure 1:
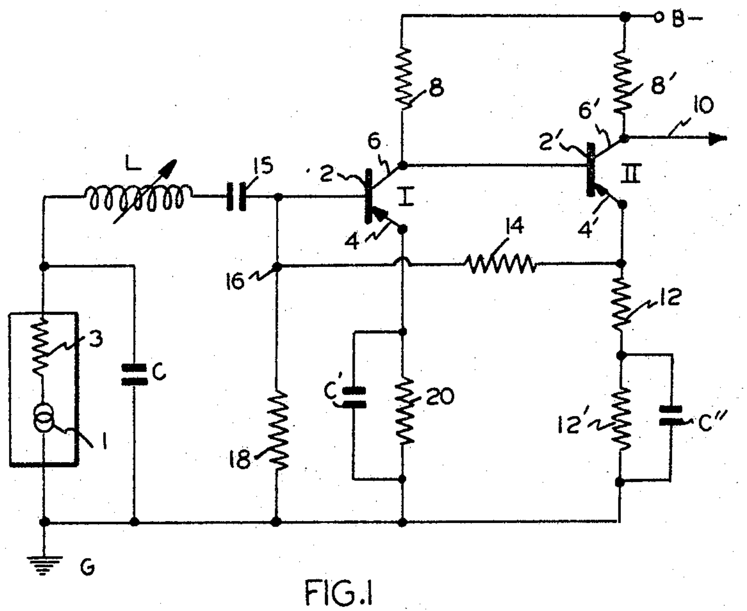

This application is a continuation of Ser. No. 202,410, filed June 14, 1962 for "Wide-Band Transistor Amplifier System," now abandoned.

The present invention relates to transistor amplifier circuits, and, more particularly, to amplifier circuits adapted for use with substantially constant-current high-impedance signal sources, such as television vidicon pickup-devices, and the like.

In circuits employing vidicon and similar substantially constant-current signal sources, hereinafter generically termed "vidicons," it has been customary to employ a large input resistance for the purpose of generating relatively high voltages at low frequencies that may override microphonic noise generally produced in the first amplifier stage. The use of such high input resistance, however, inherently makes it difficult, if not impossible, to broad-band-peak the high frequencies. This is because the reactance of the input circuit capacitance is low compared to the load resistance to obtain broad-band peaking. The art has thus had to content itself with improvement of the signal-to-noise ratio at the low frequencies only. Inverse networks have been employed in subsequent circuits, however, to boost the high frequencies.

This same approach has also been applied to transistorized amplifier stages for vidicons and other substantially constant-current sources. The transistor, of course, has a relatively low input resistance, so that it has been conventional to employ as the first input stage from the vidicon or other source, an emitter-follower stage having a grounded collector. With an emitter-load resistor of the order of, say 1500 ohms, and a current gain $\beta$ of the order of 60, an effective input resistance of the order of 90,000 ohms may be obtained for the low frequencies, providing low-frequency boosting.

It has been found, however, that the noise produced in the input transistor amplifier stage substantially corresponds to that which would result if an equivalent effective noise generator were connected in series circuit with the base-to-emitter resistance, between the base and the emitter. If the impedance of the base-driving source becomes comparable to or greater than the base-to-emitter resistance itself, then such effective noise generator exists between the base and emitter, irrespective of the value of emitter load resistance that may be connected in the circuit. Amplification of noise results since the circuit performs as a grounded-emitter amplifier insofar as the noise is concerned—and this, irrespective of whether the output load is disposed in the emitter or in the collector circuit. The signal, however, will be degenerated in an emitter-follower stage, thus degrading the effective signal-to-noise ratio. Despite this fact, and despite the lack of improvement at the high-frequency end, these are the types of circuits that the art has had to employ heretofore in vidicon amplifier stages and the like.

An object of the present invention, accordingly, is to provide a new and improved wide-band transistor amplifier circuit, particularly suited for operation with a vidicon or similar constant-current high-impedance signal source, that shall not be subject to the above-described disadvantages; but that shall, to the contrary, provide substantially flat or uniform response over the lower frequencies, blending into a high-frequency peaking response, and without the necessity for the use of compensatory networks and similar devices for providing such uniform response.

A further object is to provide a novel wide-band amplifier of general utility, as well.

Other and further objects will be discussed hereinafter and will be more particularly pointed out in the appended claims.

Figure 2:
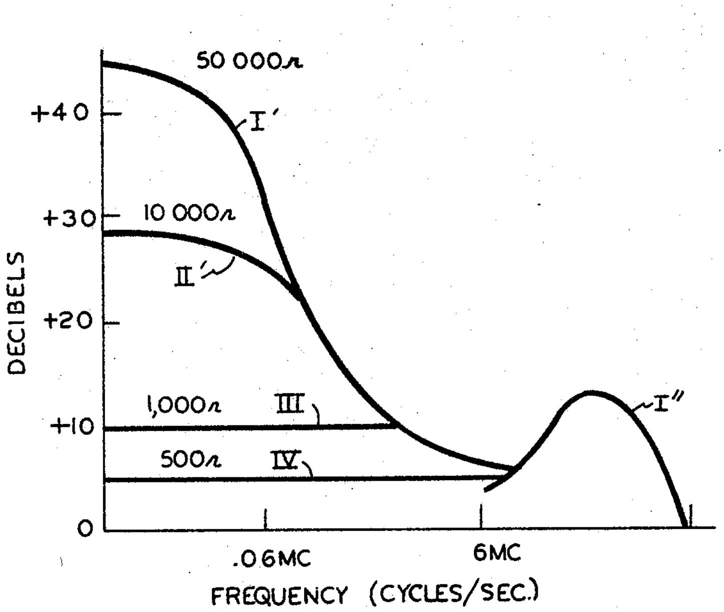

The invention will now be described in connection with the accompanying drawings FIG. 1 of which is a schematic circuit diagram of a preferred embodiment of the invention; and FIG. 2 is a graph contrasting the response of the circuit of FIG. 1 with prior-art amplifier responses.

In FIG. 1, wide-band video frequency signals are schematically shown emanating from the substantially constant current vidicon (or similar) source 1, with its high output-circuit impedance 3 of the order of hundreds of megohms, shunted by output capacitance C. The source 1 is connected through a series peaking coil L and a coupling capacitor 15 to the base electrode 2 of the transistor amplifier stage I that is to perform the wide-band amplification. The collector electrode 6 of the amplifier I is connected through a load 8 to the B— supply terminal and the emitter electrode 4 is grounded at G through an emitter load 20, by-passed at C'. The term "ground" as herein used embraces not only actual earthing but chassis and other reference potential as well. An input-circuit resistor 18 is also shown connected from a point 16 between the coupling capacitor 15 and the base electrode 2 and ground G. Opposite ends of capacitance C constitute output terminals of the source, while opposite ends of resistor 18 constitute input terminals of the amplifier.

Universal prior practice has required that one attempt to obtain as high an input impedance for the transistor amplifier I as is feasible, in order to approach, as near as possible, impedance-matching with the before-mentioned high-impedance output of the source 1. There are, however, limitations on how close a match can actually be attained; but input impedances of tens of thousands of ohms and greater have widely been employed.

In the graph of FIG. 2, curve I' plots the response (along the ordinate) of an amplifier I in the circuit of FIG. 1, having a 50,000 ohm input impedance, as a function of frequency (logarithmically indicated along the abscissa) in the range of signals up to about 6 megacycles. Curve I'' shows the high-frequency peaking attained with the peaking coil L, in the input circuit of the amplifier I, resonating with the vidicon output-circuit capacitance C at a high frequency above 6 megacycles. It is readily observable that the response curve I' is far from flat or uniform and that, while it starts out relatively flat at its initial low-frequency portion, it steeply curves downward and abruptly intersects the left-hand rising portion of the high-frequency peaking curve I''.

To provide more uniform amplification response, therefore, compensatory networks having responses inverse to the downwardly curving response I' have widely been employed, adding complexity and cost to the circuitry.

In accordance with the present invention, however, the highly novel result of a uniform response can be attained without the necessity for compensating networks or other circuits. This novel result requires (1) the aforesaid resonating of the peaking coil L with the output-circuit capacitance C of the high impedance source (resonance of the coil with the other capacitances in the input circuit of the amplifier I being negligible and not appreciably affecting the necessary resultant resonance between the coil and the capacitance C) and (2) the adjusting of the input-circuit impedance of the transistor amplifier I in a manner that is exactly opposite to the teachings of the art. Specifically, the input circuit impedance of the amplifier I is adjusted to as low a value as is feasible, of the order of hundreds of ohms, to provide a deliberate bad impedance mis-match to the high output-circuit impedance of the source 1.

The phenomenon underlying this badly mis-matched concept may be understood by a study of the successive curves II', III and IV of FIG. 2. In the curve II', it will be observed that, for an input impedance of 10,000 ohms, the decibel loss in the response of the amplifier I still has the same shape or characteristic as curve I', requiring the compensatory networks and the like, before discussed, to effect lower-frequency equalization or equalized amplitude response. Similarly, even an amplifier input impedance of the order of 1,000 ohms, curve III, has somewhat of these characteristics. While the responses of curves I', II', and III thus create the demand for an unusual shape of compensating response to smooth out the low-frequency and high-frequency peaking characteristics, curve IV, representing an input impedance of several hundred ohms, is substantially flat all the way out to the high-frequency peaking curve I'', blending well into the rising left-hand portion thereof.

It will thus be evident that the desired end of providing a flat or uniform response over the complete band up to about 6 megacycles, and providing a continuity and blending into the subsequent high-frequency peaking characteristic is attained, not by trying to get as high an amplifier input impedance as possible, as in the prior art, but by obtaining, rather, a very low input impedance of the order of several hundred ohms. In order to obtain this result, however, and simultaneously to accommodate for possible changes in amplitude characteristics caused by temperature variations or aging of the transistor amplifier, it has been found preferable to produce the low input-circuit impedance of the order of a few hundred ohms, by way of an appropriate feedback from the output of the amplifier I to the input thereof. While this might be done directly from the collector 6 through a capacitor, not shown, as is well known, it is preferred to employ a second transistor stage II, the base 2' of which is connected to the output collector electrode 6 of the stage I, and the collector 6' of which is connected through a collector load 8' to the B— terminal. The output of the stage II is extracted along conductor 10.

The emitter 4' of the second stage II is connected through an un-bypassed resistor 12 and a further resistor 12' to the ground terminal G. The section 12' is by-passed by capacitor C'' for all frequencies. Feedback is provided from the emitter electrode 4' by way of the feedback resistor 14 to the terminal 16 that connects with the base electrode 2 of the amplifier I and through the before-mentioned base-to-ground input resistor 18. The value of the feedback resistance 14 in this emitter-follower feedback from the stage II is selected such that sufficient current is fed back to the base 2 to reduce the effective input impedance thereof to the order of the few hundred ohms previously discussed.

In this manner, any variations in temperature or other stability characteristics of the transistor stage I, including aging, are automatically compensated for, and the simultaneous result is obtained of providing a uniform response that is contiguous with the high-frequency peaking curve.

In a typical circuit, for example, embodying transistors I and II of type PADT28, the following circuit components have been found to work admirably to effect this result, by feeding back about one-fourth the orginal input voltage to the transistor I, and providing an input impedance of the order of 250 ohms:

Resistor:

| | | |
|---|---|---|
| 14 | ohms | 22K |
| 18 | do | 6.8K |
| 20 | do | 1K |
| 8, 8' | do | 3.3K |
| 12 | do | 150 |
| 12' | do | 4.7K |

Capacitors:

| | | |
|---|---|---|
| C', C'' | μμf | 100 |

Further modifications will occur to those skilled in the art and all such are considered to fall within the spirit and scope of the invention as defined in the appended claims.

What is claimed is:

1. A wide-band amplifier system comprising, in combination, a source of wide-band video-frequency signals, said source having a pair of output terminals with an output impedance between said terminals of substantially hundreds of megohms and including a shunt capacitance, a transistor video amplifier having an input with base and emitter input terminals and having an output, feedback circuit means connecting the output of said amplifier to its input for providing an effective amplifier input impedance of only substantially hundreds of ohms, whereby said input impedance of said amplifier is mis-matched to the output impedance of said source, means including a series inductance and capacitance connecting one of said output terminals of the source to said base input terminal of the amplifier, said inductance being adjusted to resonate substantially only with said shunt capacitance at a frequency at the high end of said wide band, and means connecting the other output terminal of the source to the emitter input terminal of the amplifier.

2. The system of claim 1, said amplifier having an input transistor stage with base and emitter electrodes connected to said base and emitter input terminals, respectively, and having an output transistor stage with a pair of isolated electrodes, said feedback circuit means comprising a connection to one of said isolated electrodes and said amplifier having means for deriving a signal from the other of said isolated electrodes.

3. The system of claim 2, said one isolated electrode being the emitter and said other isolated electrode being the collector of said output transistor stage.

References Cited

UNITED STATES PATENTS

| | | | |
|---|---|---|---|
| 2,812,390 | 11/1957 | Van Overbeek | 330—21 |
| 2,936,424 | 5/1960 | Steggerda | 330—21 |
| 3,136,848 | 6/1964 | Woodworth | 330—19 X |
| 3,162,820 | 12/1964 | Horowitz | 330—21 |
| 3,168,706 | 2/1965 | Brenig | 330—25 X |

FOREIGN PATENTS

| | | |
|---|---|---|
| 212,765 | 1/1958 | Australia. |
| 901,441 | 7/1962 | Great Britain. |

OTHER REFERENCES

Fink: Television Engineering HBK, McGraw-Hill, New York, 1957, pp. 16–104 and 16–105.

ROY LAKE, *Primary Examiner.*

NATHAN KAUFMAN, *Examiner.*

F. D. PARIS, *Assistant Examiner.*